United States Patent
Kim

(10) Patent No.: US 8,637,893 B2
(45) Date of Patent: Jan. 28, 2014

(54) LIGHT EMITTING DEVICE PACKAGE, METHOD OF MANUFACTURING THE SAME, AND LIGHTING SYSTEM

(75) Inventor: Geun Ho Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 3 days.

(21) Appl. No.: 13/019,657

(22) Filed: Feb. 2, 2011

(65) Prior Publication Data

US 2011/0186872 A1 Aug. 4, 2011

(30) Foreign Application Priority Data

Feb. 4, 2010 (KR) ........................ 10-2010-0010245

(51) Int. Cl.
*H01L 33/36* (2010.01)
*H01L 33/38* (2010.01)
*H01L 33/48* (2010.01)

(52) U.S. Cl.
USPC ................................. 257/99; 257/88; 257/98

(58) Field of Classification Search
None
See application file for complete search history.

(56) References Cited

U.S. PATENT DOCUMENTS

| 6,946,309 | B2 * | 9/2005 | Camras et al. | .............. 438/26 |
| 7,095,059 | B2 * | 8/2006 | Uemura et al. | .............. 257/99 |
| 7,235,820 | B2 | 6/2007 | Shim et al. | |
| 7,329,905 | B2 | 2/2008 | Ibbetson et al. | |
| 8,202,742 | B2 | 6/2012 | Paolini et al. | |
| 2006/0214182 | A1 * | 9/2006 | Udagawa | ............. 257/103 |
| 2007/0234563 | A1 * | 10/2007 | Sakaguchi et al. | ............. 29/843 |
| 2008/0006836 | A1 | 1/2008 | Lee | |
| 2010/0019264 | A1 | 1/2010 | Jeong | |
| 2010/0279448 | A1 | 11/2010 | Kim et al. | |
| 2010/0308357 | A1 * | 12/2010 | Horie et al. | .............. 257/98 |

FOREIGN PATENT DOCUMENTS

| JP | 2004-311982 A | 11/2004 | |
| JP | 2006-32779 A | 2/2006 | |
| JP | 2006-287189 | 10/2006 | |
| JP | 2006-303397 | 11/2006 | |
| JP | 2006-339591 | 12/2006 | |
| JP | 2007-324608 | 12/2007 | |
| JP | 2008-505508 | 2/2008 | |
| JP | 2008-78225 | 4/2008 | |
| JP | 2009-135466 A | 6/2009 | |
| KR | 10-2010-0008123 A | 1/2010 | |
| WO | WO-2009/057655 A1 * | 5/2009 | ............. H01L 33/00 |
| WO | WO 2009/057655 A1 | 5/2009 | |

* cited by examiner

*Primary Examiner* — Johannes P Mondt
(74) *Attorney, Agent, or Firm* — McKenna Long & Aldridge LLP

(57) ABSTRACT

The light emitting device package includes a light emitting structure including a first conductive semiconductor layer, an active layer partially formed under the first conductive semiconductor layer, and a second conductive semiconductor layer under the active layer, an insulating layer disposed on lateral surfaces of the active layer and the second conductive semiconductor layer, an electrode disposed under the first conductive semiconductor layer and electrically insulated from the active layer and the second conductive semiconductor layer by the insulating layer, and a metallic support layer disposed under the second conductive semiconductor layer, the insulating layer, and the electrode and including a first conductive region electrically connected to the electrode, a second conductive region electrically connected to the second conductive semiconductor layer, and an insulating region disposed between the first and second conductive regions and insulating the first conductive region from the second conductive region.

18 Claims, 9 Drawing Sheets

US 8,637,893 B2

LIGHT EMITTING DEVICE PACKAGE, METHOD OF MANUFACTURING THE SAME, AND LIGHTING SYSTEM

The present application claims priority of Korean Patent Application No. 10-2010-0010245 filed on Feb. 4, 2010, which is hereby incorporated by reference in its entirety as if fully set forth herein.

BACKGROUND

The exemplary embodiment relates to a light emitting device package, a method of manufacturing the same and a lighting system.

A light emitting diode (LED) is a semiconductor light emitting device that converts electric current into light.

The wavelength of light emitted from the LED may vary depending on a semiconductor material used for manufacturing the LED. This is because the wavelength of the emitted light varies depending on the bandgap of the semiconductor material, that is, the energy difference between valance band electrons and conduction band electrons.

The LED can generate light having high brightness. As a result the LED has been expensively used as a light source for display devices, vehicles, or lighting devices. In addition, the LED can represent a white color having superior light efficiency by employing luminescence materials or combining LEDs having various colors.

SUMMARY

The exemplary embodiment provides a light emitting device package having a unique structure, a method of manufacturing the same, and a lighting system.

The embodiment provides a light emitting device package simplified in a structure and reduced in size, a method of manufacturing the same, and a lighting system.

According to the embodiment, a light emitting device package includes a light emitting structure layer including a first conductive semiconductor layer, an active layer partially formed under the first conductive semiconductor layer, and a second conductive semiconductor layer under the active layer, an insulating layer disposed on lateral surfaces of the active layer and the second conductive semiconductor layer and partially disposed under the second conductive semiconductor layer, an electrode disposed under the first conductive semiconductor layer and electrically insulated from the active layer and the second conductive semiconductor layer by the insulating layer, and a metallic support layer disposed under the second conductive semiconductor layer, the insulating layer, and the electrode and including a first conductive region electrically connected to the electrode, a second conductive region electrically connected to the second conductive semiconductor layer, and an insulating region disposed between the first and second conductive regions and electrically insulating the first conductive region from the second conductive region.

According to the embodiment, the method of manufacturing the light emitting device package includes forming a light emitting structure layer including a first conductive semiconductor layer, an active layer, and a second conductive layer on a growth substrate, selectively removing the second conductive semiconductor layer and the active layer such that the first conductive semiconductor layer is partially exposed, forming an insulating layer on lateral surfaces and a part of top surfaces of the second conductive semiconductor layer and the active layer, forming an electrode on the first conductive semiconductor layer, forming a metallic support layer on the second conductive semiconductor layer, the insulating layer, and the electrode, forming an insulating region by selectively oxidizing the metallic support layer such that a first conductive region electrically connected to the electrode is separated from a second conductive region electrically connected to the second conductive semiconductor layer, and performing an etching process to divide the light emitting structure layer and the metallic support layer in a package unit.

According to the embodiment, a lighting system employing a light emitting device package as a light source includes a light emitting module including a substrate and at least one light emitting device package on the substrate. The light emitting device package includes a light emitting structure layer including a first conductive semiconductor layer, an active layer partially formed under the first conductive semiconductor layer, and a second conductive semiconductor layer under the active layer, an insulating layer disposed on lateral surfaces of the active layer and the second conductive semiconductor layer and partially disposed under the second conductive semiconductor layer, an electrode disposed under the first conductive semiconductor layer and electrically insulated from the active layer and the second conductive semiconductor layer by the insulating layer, and a metallic support layer disposed under the second conductive semiconductor layer, the insulating layer, and the electrode and including a first conductive region electrically connected to the electrode, a second conductive region electrically connected to the second conductive semiconductor layer, and an insulating region disposed between the first and second conductive regions and electrically insulating the first conductive region from the second conductive region.

DETAILED DESCRIPTION OF THE EMBODIMENTS

Figure 1:
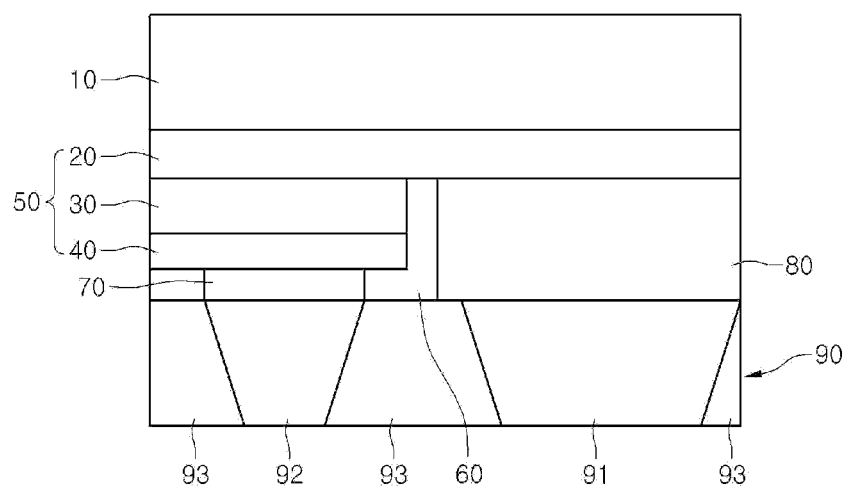
FIG. 1 is a view showing a light emitting device package according to a first exemplary embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device package according to the exemplary embodiments, a method of manufacturing the same, and a lighting system will be described in detail with reference to accompanying drawings.

FIG. 1 is a view showing a light emitting device package according to the first exemplary embodiment.

Referring to FIG. 1, the light emitting device package according to the first embodiment may include a light emitting structure layer 50 including a first conductive semiconductor layer 20, an active layer 30, and a second conductive semiconductor layer 40. The active layer 30 may be interposed between the first conductive semiconductor layer 20 and the first conductive semiconductor layer 20 to emit light as power is applied to the first and second conductive semiconductor layers 20 and 40.

The light emitting structure layer 50 may include compound semiconductor layers of group III-V elements. For example, the light emitting structure layer 50 may include the first conductive semiconductor layer 20, the active layer 30 under the first conductive semiconductor layer 20, and the second conductive semiconductor layer 40 under the active layer 30.

For example, the first conductive semiconductor layer 20 may include an N type semiconductor layer. The first conductive semiconductor layer 20 may include a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 20 may be selected from the group consisting of InAlGaN, GaN, AlGaN, AlInN, InGaN, AN, and InN, and may be doped with N type dopants such as Si, Ge, Sn, Se, or Te. The first conductive semiconductor layer 20 may have a single layer structure or a multiple layer structure, but the embodiment is not limited thereto.

The active layer 30 emits the light based on the band gap difference of the energy band according to material constituting the active layer 30 through the recombination of electrons (or holes) injected through the first conductive semiconductor layer 20 and holes (or electrons) injected through the second conductive semiconductor layer 40.

The active layer 30 may have a single quantum well structure, a multiple quantum well (MQW) structure, a quantum dot structure, or a quantum wire structure, but the embodiment is not limited thereto.

The active layer 30 may include semiconductor material having a compositional formula of $In_xAl_yGa_{1-x-y}N$ ($0 \leq x \leq 1$, $0 \leq y \leq 1$, $0 \leq x+y \leq 1$). If the active layer 30 has the MQW structure, the active layer 30 may have a stack structure of a plurality of well layers and a plurality of barrier layers. For example, the active layer 30 may include a stack structure of InGaN well/GaN barrier layers.

A clad layer (not shown) doped with N type dopants and P type dopants may be formed on and/or below the active layer 30, and may include an AlGaN layer or an InAlGaN layer.

For example, the second conductive semiconductor layer 40 may include a P type semiconductor layer. The second conductive semiconductor layer 40 may include a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 40 may be selected from the group consisting of InAlGaN, GaN, AlGaN, InGaN, AlInN, AN, and InN. The second conductive semiconductor layer 40 may be doped with P type dopants such as Mg, Zn, Ca, Sr, and Ba.

Meanwhile, the first conductive semiconductor layer 20 may include a P type semiconductor layer, and the second conductive semiconductor layer 40 may include an N type semiconductor layer. In addition, a third conductive semiconductor layer (not shown) including an N type semiconductor layer or a P type semiconductor layer may be formed under the second conductive semiconductor layer 40. The light emitting structure layer 50 may include at least one of an NP, PN, NPN, PNP junction structures. In addition, the doping concentration of impurities in the first and second conductive semiconductor layers 20 and 40 may be uniform or irregular. In other words, the light emitting structure layer may have various structures, but the embodiment is not limited thereto.

In the light emitting structure layer 50, parts of the active layer 30 and the second conductive semiconductor layer 40 may be selectively removed, and the active layer 30 and the second conductive semiconductor layer 40 may have regions smaller than the first conductive semiconductor layer 20.

A growth substrate 10 is provided on the light emitting structure layer 50. The growth substrate 10 may include at least one of sapphire ($Al_2O_3$), Si, SiC, GaAs, GaN, AN, ZnO, MgO, and $Ga_2O_3$. For example, the growth substrate 10 may include a sapphire substrate.

The growth substrate 10 may contact with the first conductive semiconductor layer 20. Although not shown, an undoped nitride layer may be formed between the first conductive semiconductor layer 20 and the growth substrate 10.

An insulating layer 60 may be formed at lateral surfaces of the active layer 30 and the second conductive semiconductor layer 40. In addition, the insulating layer 60 may be partially formed under the second conductive semiconductor layer 40 such that the second conductive semiconductor layer 40 is partially exposed.

The insulating layer 60 may include an organic material or an inorganic material, and includes an insulating material. For example, the insulating layer 60 may include a silicon oxide layer or a silicon nitride layer.

An ohmic contact layer 70 may be formed under the second conductive semiconductor layer 40, and an electrode 80 may be formed under the first conductive semiconductor layer 20. The ohmic contact layer 70 may be electrically connected to the second conductive semiconductor layer 40, and the electrode 80 may be electrically connected to the first conductive semiconductor layer 20. The ohmic contact layer 70 and the electrode 80 may be electrically insulated from each other by the insulating layer 60.

The ohmic contact layer 70 may include a transparent conductive oxide such as ITO, a transparent conductive oxynitride, or a transparent conductive nitride, metal including at least one selected from the group consisting of Ni, Ag, and Au, or the alloy thereof. The electrode 80 may include metal including at least one of Au, Al, and Pt, or the alloy thereof.

A metallic support layer 90 may be provided under the insulating layer 60, the ohmic contact layer 70, and the electrode 80. The ohmic contact layer 70 can be selectively formed. If the ohmic contact layer 70 is not formed, a metallic layer having high reflectance may be formed instead of the ohmic contact layer 70, or the metallic support layer 90 may make direct contact with the second conductive semiconductor layer 40.

Figure 2:
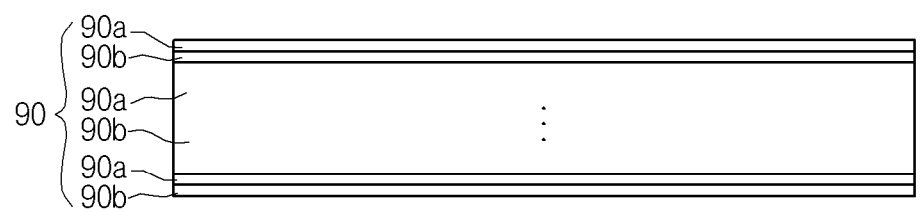
FIG. 2 is a view showing a metallic support layer in a light emitting device package according to the first embodiment.

Referring to FIG. 2, the metallic support layer 90 may include a first metallic layer 90a having a compressive stress and a second metallic layer 90b having tensile stress. When the first and second metallic layers 90a and 90b are defined as one unit layer, the metallic support layer 90 may include a plurality of unit layers.

For example, the metallic support layer 90 may include two pairs to 80 pairs of the first and second metallic layers 90a and 90b. Preferably, the metallic support layer 90 may include 30 pairs to 70 pairs of the first and second metallic layers 90a and 90b. More preferably, the metallic support layer 90 may include 40 pairs to 60 pairs of the first and second metallic layers 90a and 90b.

Since the first and second metallic layers 90a and 90b may have stresses opposite to each other, the compressive stress of the first metallic layer 90a may be cancelled from the tensile stress of the metallic layer 90b, so that the thick metallic support layer 90 may be formed. In addition, the metallic support layer 90 may include a single metallic layer.

For example, the first and second metallic layers 90a and 90b may have a thickness in the range of about 0.1 μm to about 10 μm. Preferably, one of the first and second metallic layers 90a and 90b may have a thickness of about 0.4 μm to about 0.8 μm. A remaining one of the first and second metallic layers 90a and 90b may have a thickness of about 0.8 μm to about 1.2 μm. Since the metallic support layer 90 may have a stack structure of the first and second metallic layers 90a and 90b, the metallic support layer 90 may have a thickness in the range of about 50 μm to about 200 μm.

The metallic support layer 90 may include first and second conductive regions 91 and 92 and an insulating region 93 disposed around the lateral surfaces of the first and second conductive regions 91 and 92 such that the first conductive region 91 may be electrically insulated from the second conductive region 92.

The first and second conductive regions 91 and 92 may include metallic layers, and the insulating region 93 may include an oxide metallic layer obtained by selectively oxidizing the metallic layer. The metallic layer 90 may include a metallic material of a copper substrate or an aluminum substrate. For example, the metallic support layer 90 may include an aluminum substrate. In other words, the first and second conductive regions 91 and 92 may include an aluminum substrate, and the insulating region 93 may include aluminum oxide obtained by selectively oxidizing the aluminum substrate.

The insulating region 93 may have a width narrowed as the insulating region 93 is closer to the light emitting structure layer 50. The first and second conductive regions 91 and 92 may have a width widened as the first and second conductive regions 91 and 92 are closer to the light emitting structure layer 50.

Although the exemplary embodiment may disclose the first and second conductive regions 91 and 92, and the insulating region 93 formed by selectively oxidizing a metallic layer, the first conductive region 91, the second conductive region 92, and the insulating region 93 may be formed by depositing metallic layers on the places for the first and second conductive regions after an insulating material has been formed at the place for the insulating region.

In addition, the first and second conductive regions 91 and 92 and the insulating region 93 may be formed by selectively removing a metallic layer from the place for the insulating region after the metallic layer has been formed at the places of the first and second conductive regions and the place of the insulating region.

The light emitting device package may be provided under the first and second conductive regions 91 and 92. A part of the first conductive region 91 may overlap with the first conductive semiconductor layer 20 in a vertical direction, and may not overlap with the active region 30 and the second conductive semiconductor layer 40 in the vertical direction. In addition, a part of the second conductive region 92 may overlap with the first conductive semiconductor layer 20, the second conductive semiconductor layer 40, and the active layer 30 in a vertical direction.

Since the first and second conductive regions 91 and 92 and the insulating region 93 are formed by selectively oxidizing the metallic support layer 90, the first and second regions 91 and 92 may have the same thickness, and may be aligned on a same horizontal plane.

If power is applied to the first and second conductive regions 91 and 92, the power may be applied to the first and second conductive semiconductor layers 20 and 40 through the electrode 80 and the ohmic contact layer 70 so that the active layer 30 generates light. The light generated from the active layer 30 may be emitted outside through the lateral surface of the light emitting structure layer 50 or the growth substrate 10. A part of the light from the active layer 30 may be reflected by the metallic support layer 90 and emitted outside through the lateral surface of the light emitting structure layer 50 or the growth substrate 10.

According to the first exemplary embodiment, a light emitting device package, which approximates the light emitting structure layer 50 in size, can be manufactured by using the metallic support layer 90.

Figure 3:
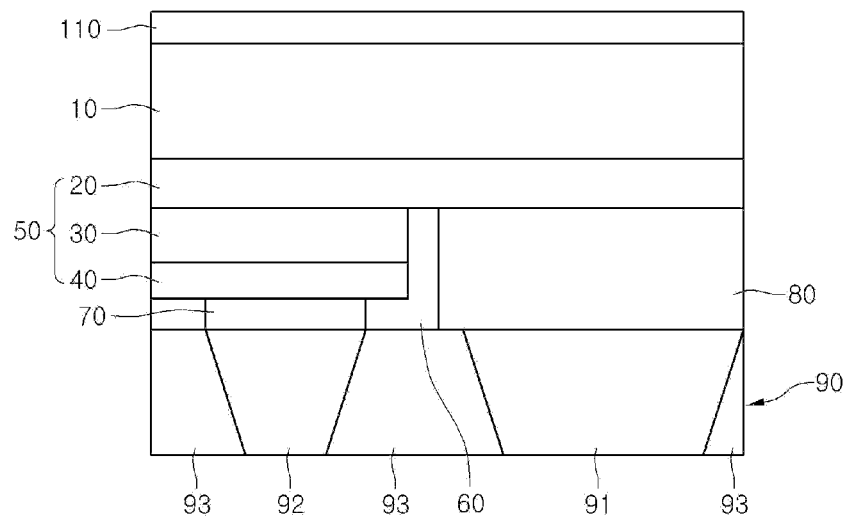
FIG. 3 is a view showing a light emitting device package according to a second exemplary embodiment.

FIG. 3 is a view showing a light emitting device package according to the second exemplary embodiment.

Hereinafter, the second embodiment will be described while focusing on the difference from the first embodiment.

Referring to FIG. 3, different from the first embodiment, the light emitting device package according to the second embodiment may include a luminescence layer 110 formed on the growth substrate 10. The luminescence layer 110 may include a luminescence material, and may change the wavelength of light generated from the active layer 30. For example, if blue light of about 470 nm is generated from the active layer 30, and the luminescence layer 110 includes a yellow luminescence material, the light generated from the active layer 30 is combined with the light pumped in the luminescence layer 110, so that white light can be generated.

Figure 4:
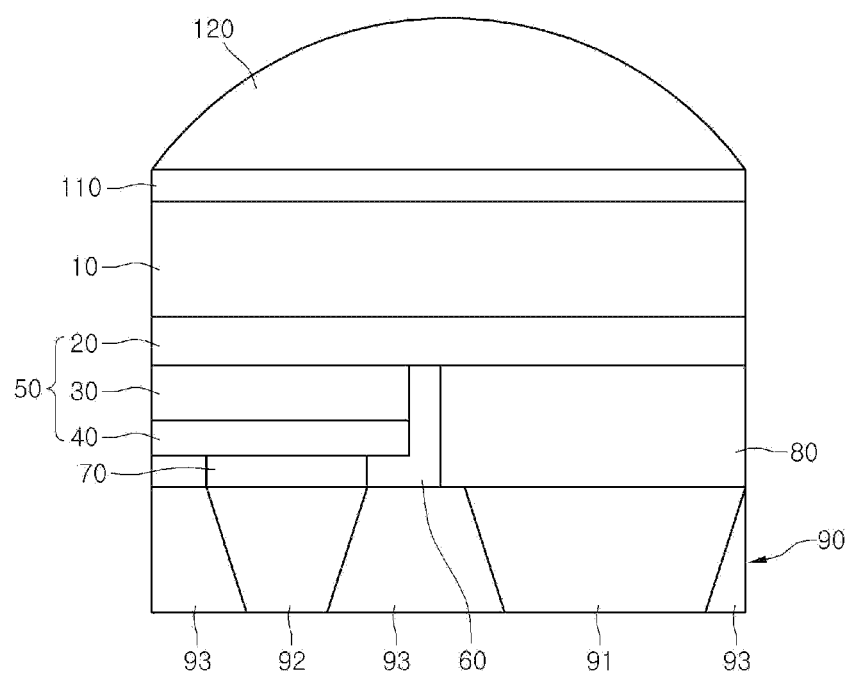
FIG. 4 is a view showing a light emitting device package according to a third exemplary embodiment.

FIG. 4 is a view showing a light emitting device package according to a third exemplary embodiment.

Hereinafter, the third embodiment will be described while focusing on the difference from the second embodiment.

Referring to FIG. 4, differently from the second embodiment, the light emitting device package according to the third embodiment may include a lens 120 formed on the luminescence layer 110. The lens 120 may be formed in the shape of a dome having a convex top surface by using silicone gel or epoxy gel, so that light, which is emitted to the outside through the growth substrate 10 and the luminescence layer 110, can be effectively extracted.

Figure 5:
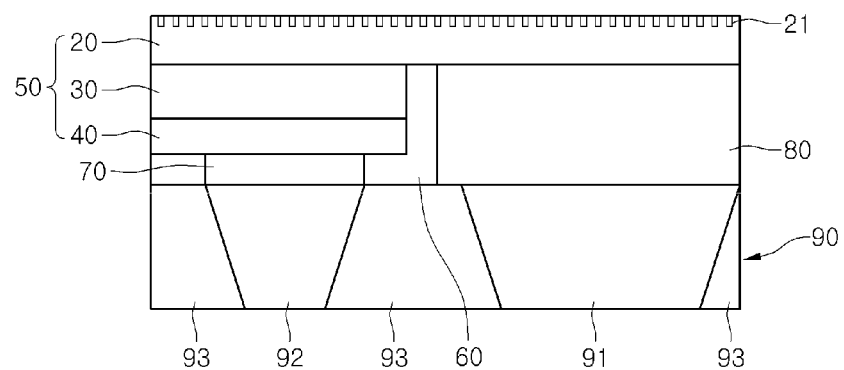
FIG. 5 is a view showing a light emitting device package according to a fourth exemplary embodiment.

FIG. 5 is a view showing a light emitting device package according to a fourth exemplary embodiment.

Hereinafter, the fourth embodiment will be described while focusing on the difference from the first embodiment.

Referring to FIG. 5, differently from the first embodiment, in the light emitting device package according to the fourth embodiment, the growth substrate 10 may be removed from the first conductive semiconductor layer 20. The first conductive semiconductor layer 20 may be provided on the top surface thereof with a light extraction structure, such as a photonic crystal structure 21, having a hole shape or a column shape.

Figure 6:
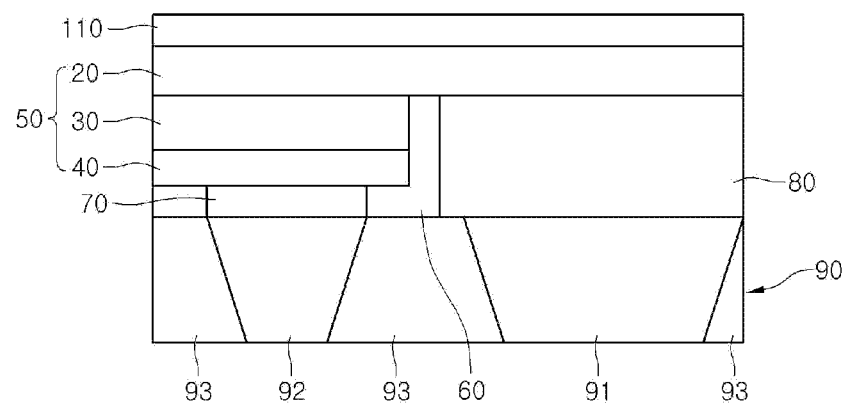
FIG. 6 is a view showing a light emitting device package according to a fifth exemplary embodiment.

FIG. 6 is a view showing a light emitting device package according to a fifth exemplary embodiment.

Hereinafter, the fifth embodiment will be described while focusing on the difference from the fourth embodiment.

Referring to FIG. 6, differently form the fourth embodiment, in the light emitting device package according to the fifth embodiment, the growth substrate 10 may be removed from the first conductive semiconductor layer 20, and the luminescence layer 110 may be formed on the first conductive semiconductor layer 20.

Figure 7:
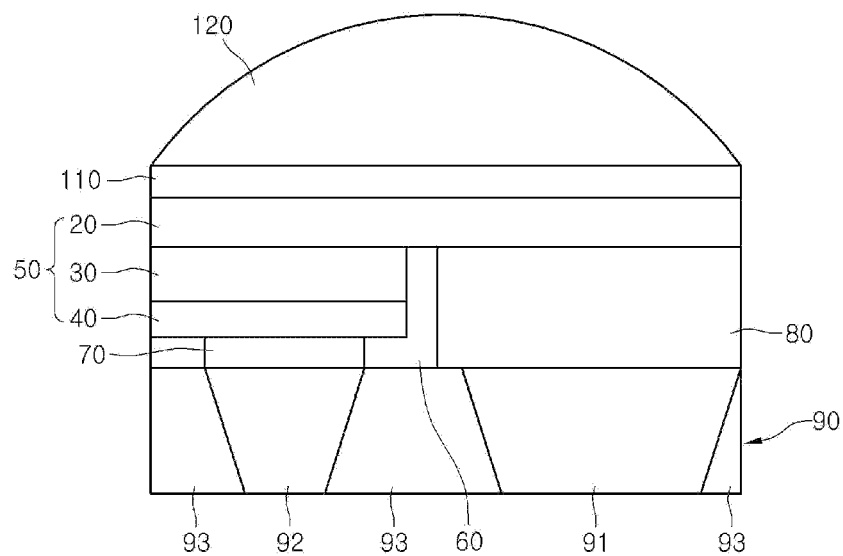
FIG. 7 is a view showing a light emitting device package according to a sixth exemplary embodiment.

FIG. 7 is a view showing a light emitting device package according to a sixth exemplary embodiment.

Hereinafter, the sixth embodiment will be described while focusing on the difference from the fifth embodiment.

Referring to FIG. 7, differently from the fifth embodiment, in the light emitting device package according to the sixth embodiment, the lens 120 may be formed on the luminescence layer 110. The lens 120 may formed with a convex top surface by using silicone gel or epoxy gel so that light emitted to the outside through the luminescence layer 110 can be effectively extracted.

FIGS. 8 to 16 are views showing a method of manufacturing the light emitting device package according to the exemplary embodiment.

Figure 8:
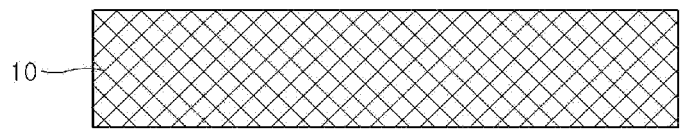
FIGS. 8 to 16 are views showing a method of manufacturing a light emitting device package according to an exemplary embodiment.
Figure 9:
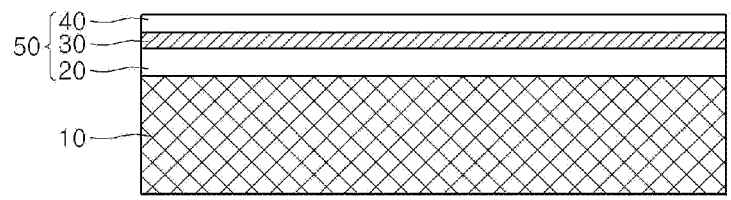

Referring to FIGS. 8 and 9, the growth substrate 10 is prepared. The light emitting structure layer 50 including the first conductive semiconductor layer 20, the active layer 30, and the second conductive semiconductor layer 40 may be formed on the growth substrate 10.

Although not shown, before the first conductive semiconductor layer 20 is formed on the growth substrate 10, an undoped nitride layer may be formed on the growth substrate 10

The growth substrate 10 may include one selected from the group consisting of sapphire ($Al_2O_3$), Si, SiC, GaAs, AN, GaN, ZnO, MgO, and $Ga_2O_3$. For example, the growth substrate 10 may include a sapphire substrate.

The undoped nitride layer may include a GaN-based semiconductor layer. For example, the undoped nitride layer may include an undoped GaN layer grown by injecting trimethyl gallium (TMGa) gas, hydrogen ($H_2$) gas, and ammonia ($NH_3$) gas into the chamber.

The first conductive semiconductor layer 20 may be grown by injecting TMGa gas, $SiH_4$ gas including N type impurities (e.g., Si), $H_2$ gas, $NH_3$ gas into the chamber. The active layer 30 and the second conductive semiconductor layer 40 may be formed on the first conductive semiconductor layer 20.

The active layer 30 may have a single quantum well structure, a multiple quantum well (MQW) structure, a quantum wire structure or a quantum dot structure. The active layer 30 may have the stack structure of InGaN well/GaN barrier layers.

The second conductive semiconductor layer 40 may be grown by injecting TMGa gas, $(EtCp_2Mg)\{Mg(C_2H_5C_5H_4)_2\}$ gas including P type impurities (e.g., Mg), $H_2$ gas, and NH3 gas into the chamber.

Figure 10:
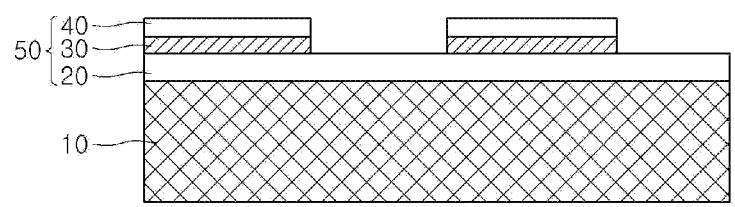

Referring to FIG. 10, a MESA etching process may be performed by selectively removing the second conductive semiconductor layer 40 and the active layer 30. Through the MESA etching process, a part of the first conductive semiconductor layer 20 may be exposed upward. In this case, the first conductive semiconductor layer 20 may be partially removed.

Figure 11:
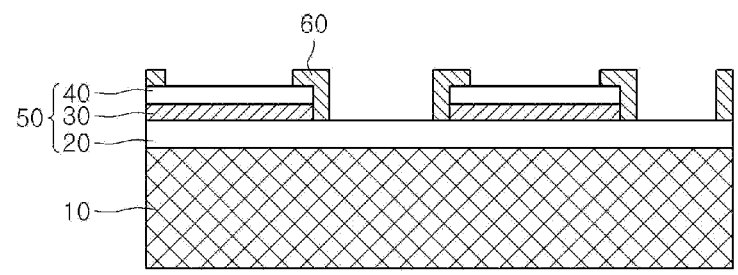

Referring to FIG. 11, the insulating layer 60 may be formed on a part of the top surface and the lateral surfaces of the active layer 30 and the second conductive semiconductor layer 40. The insulating layer 60 may include a material having a superior insulating property and providing superior bonding strength with respect to the active layer 30 and the second conductive semiconductor layer 40. For example, the insulating layer 60 may include a silicon oxide layer or a silicon nitride layer.

As the insulating layer 60 is formed, the second conductive semiconductor layer 40 may be surrounded by the insulating layer 60 except for a part of the top surface of the second conductive semiconductor layer 40.

Figure 12:
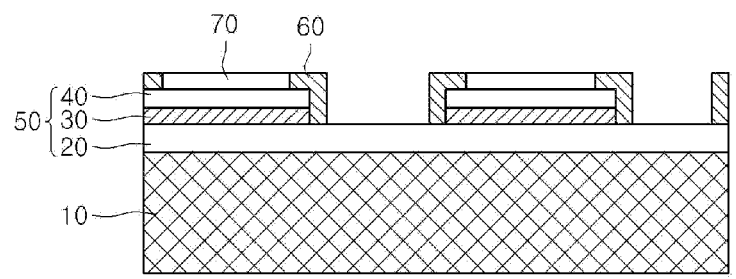

Referring to FIG. 12, the ohmic contact layer 70 may be formed on the second conductive semiconductor layer 40. The ohmic contact layer 70 may include a material having an ohmic contact characteristic with respect to the second conductive semiconductor layer 40. The process of forming the ohmic contact layer 70 may be selectively performed. Instead of the ohmic contact layer 70, a reflective layer including metal having high reflectance may be formed, or the metallic support layer 90 may directly make contact with the second conductive semiconductor as described below.

The ohmic contact layer 70 may include at least one of TCO (Transparent Conducting Oxide), TCN (Transparent Conducting Nitride), and TCON (Transparent Conducting Oxide Nitride). For example, the TCO may include one selected from the group consisting of ITO, ZnO, AZO, IZO, ATO, ZITO, Sn—O, In—O, and Ga—O. The TCN may include at least one selected from the group consisting of TiN, CrN, TaN, and In—N. The TCON may include one selected from the group consisting of ITON, ZnON, O—In—N, and IZON.

The ohmic contact layer 70 may include metal selected from the group consisting of Ni, Ag, and Au, or the alloy thereof.

The ohmic contact layer 70 may be formed through a sputtering scheme or an E-beam evaporation scheme.

Figure 13:
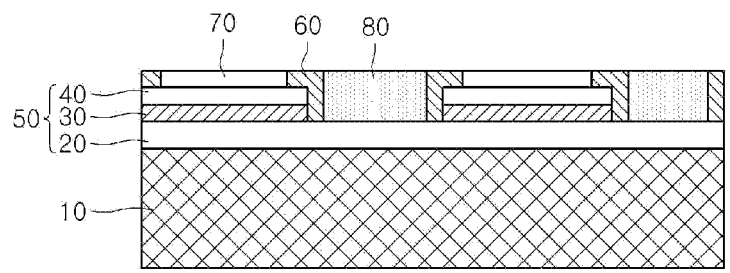

Referring to FIG. 13, the electrode 80 may be formed on the first conductive semiconductor layer 20. The electrode 80 may be formed on the first conductive semiconductor layer 20 exposed between insulating layers 60. The electrode 80 may include at least one selected from the group consisting of Au, Al, and Pt, or the alloy thereof.

Figure 14:
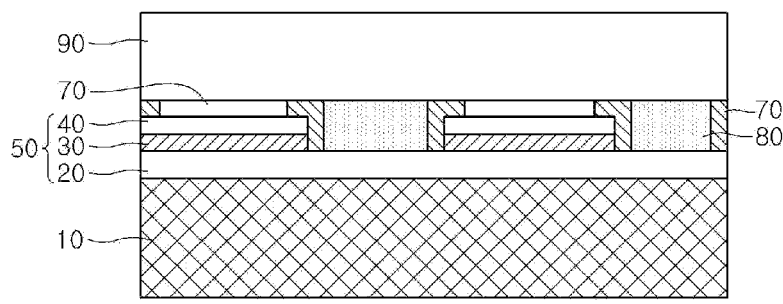

Referring to FIG. 14, the metallic support layer 90 may be formed on the insulating layer 60, the ohmic contact layer 70, and the electrode 80.

For example, the metallic support layer 90 may be formed by alternatively forming the first metallic layer 90a having tensile stress and the second metallic layer 90b having compressive stress. For example, after forming the first metallic layer 90a, the second metallic layer 90b may be formed on the first metallic layer 90a. Then, the first metallic layer 90a may again be formed on the second metallic layer 90b, and the second metallic layer 90b may again be formed on the first metallic layer 90a. The process may be repeated.

The first and second metallic layers 90a and 90b may be formed through a dry deposition scheme. The dry deposition scheme may include a sputtering scheme or an E-beam evaporation. If the sputtering scheme is used, the high-speed sputtering scheme can be used. According to the high-speed sputtering scheme, a magnetic material is coated on the rear surface of a cathode sputtering target, so that a magnetic field is formed in a direction perpendicular to an electrical field, thereby restricting the movement of electrons to the peripheral portion of the target and inducing rotary reciprocating movement of the electrons to increase the movement path of the electrons. Accordingly, the plasma density may be increased, so that the sputtering rate can be improved.

The first and second metallic layers 90a and 90b may include aluminum. If the first and second metallic layers 90a and 90b include the homogeneous metal such as aluminum, sputtering process conditions are changed, so that the first and second metallic layers 90a and 90b may have tensile stress and compressive stress, respectively.

For example, if the energy of metal subject to the sputtering or the evaporation is increased, the metal reaching the substrate can have energy sufficient to diffuse to a desirable position. Accordingly, a metallic layer having compressive stress can be formed. In order to form a metallic layer having compressive stress by increasing metallic energy, power may be increased in sputtering, the pressure of sputtering gas may be lowered, the temperature of the substrate may be increased, or the pulse sputtering scheme can be applied.

For example, pulse power and DC power may be prepared. If the pulse power is applied, a metallic layer having compressive stress may be formed. If DC power is applied, a metallic layer having tensile stress may be formed. Similarly, in the sputtering, power, the gas pressure, the temperature of the substrate are controlled, so that the metallic layers having tensile stress and compressive stress may be selectively formed.

Figure 15:
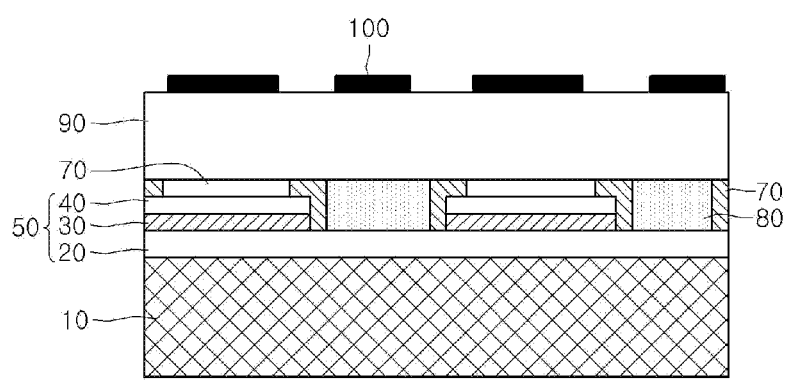

Referring to FIG. 15, a mask pattern 100 may be formed on the metallic support layer 90 by using a photoresist layer. The mask pattern 100 may expose the metallic support layer 90 corresponding to the place for the insulating region.

Figure 16:
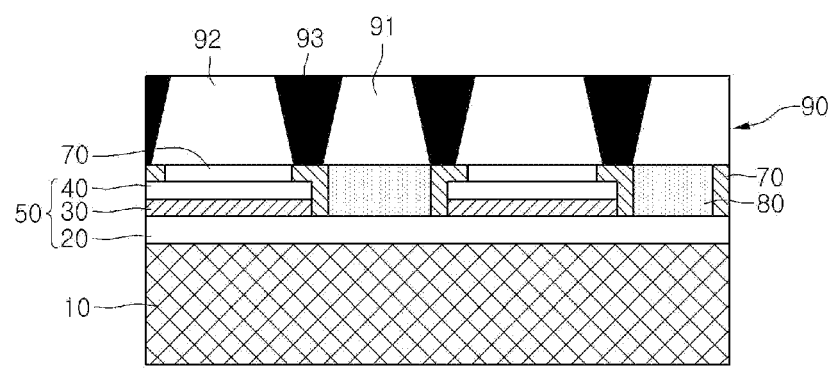

Referring to FIG. 16, the oxidation treatment may be performed with respect to the metallic support layer 90 by masking the mask pattern 100. For example, the oxidation treatment may be performed through an anodizing process.

Through the oxidation treatment, the metallic support layer 90 may be divided into the first conductive region 91, the second conductive region 92, and the insulating region 93. In other words, according to the oxidation treatment, the insulating region 93 may be formed in the metallic support layer 90. As the insulating region 93 is formed, the first and second conductive regions 91 and 92 may be divided into each other. In addition, after the oxidation treatment has been performed, the mask pattern 100 may be removed.

An etching process may be performed with respect to the structure of FIG. 16, so that the structure may be divided in a unit package. In this case, the light emitting device of FIG. 1 according to the first exemplary embodiment can be manufactured. The etching process may be performed through a laser dicing process, a wet etching process, or a blade dicing process.

In addition, when the luminescence layer 110 is formed on the growth substrate 10 before the etching process is performed after the mask pattern 100 has been removed as shown in FIG. 16, the light emitting device package of FIG. 3 according to the second exemplary embodiment can be manufactured.

In addition, when the luminescence layer 110 and the lens 120 are formed on the growth substrate 10 before the etching process is performed after the mask pattern 100 has been removed as shown in FIG. 16, the light emitting device package of FIG. 4 according to the third embodiment can be manufactured. In this case, the lens 120 may be formed in a dome shape by using silicone gel or epoxy gel.

In addition, when the growth substrate 10 is removed before the etching process is performed after the mask pattern 100 has been removed as shown in FIG. 16, the light emitting device package of FIG. 5 according to the fourth embodiment can be manufactured. In this case, the growth substrate 10 may be removed through a LLO (Laser Lift Off) process or a CLO (Chemical Lift Off) process.

In addition, when the growth substrate 10 is removed before the etching process is performed after the mask pattern 100 has been removed as shown in FIG. 16, and the luminescence layer 110 is formed on the first conductive semiconductor layer 20, the light emitting device package of FIG. 6 according to the fifth embodiment can be manufactured.

In addition, when the growth substrate 10 is removed before the etching process is performed after the mask pattern 100 has been removed as shown in FIG. 16, the luminescence layer 110 is formed on the first conductive semiconductor layer 20, and the lens 120 is formed on the luminescence layer 110, the light emitting device package of FIG. 7 according to the sixth embodiment can be manufactured.

According to the embodiments, after the metallic support layer 90 is formed under the light emitting structure layer 50, the metallic support layer 90 may be subject to selective oxidation treatment, so that a light emitting device package electrically connected to an external circuit such as a PCB can be manufactured.

Since the light emitting device package according to the embodiments may include the metallic support layer 90 electrically connected to the first and second conductive semiconductor layers 20 and 40, the light emitting device package has a structure such that heat can be effectively transferred to a PCB or a heat sink provided under the metallic support layer 90.

In the light emitting device package according to the embodiment, the metallic support layer 90 supporting the light emitting structure layer 50 and electrically connected to the light emitting structure layer 50 may be formed through a dry deposition scheme. Accordingly, the reliability for the light emitting device package according to the embodiment can be prevented from degraded due to cracks or low heat transfer characteristics occurring in a conventional scheme employing solder metal.

Figure 17:
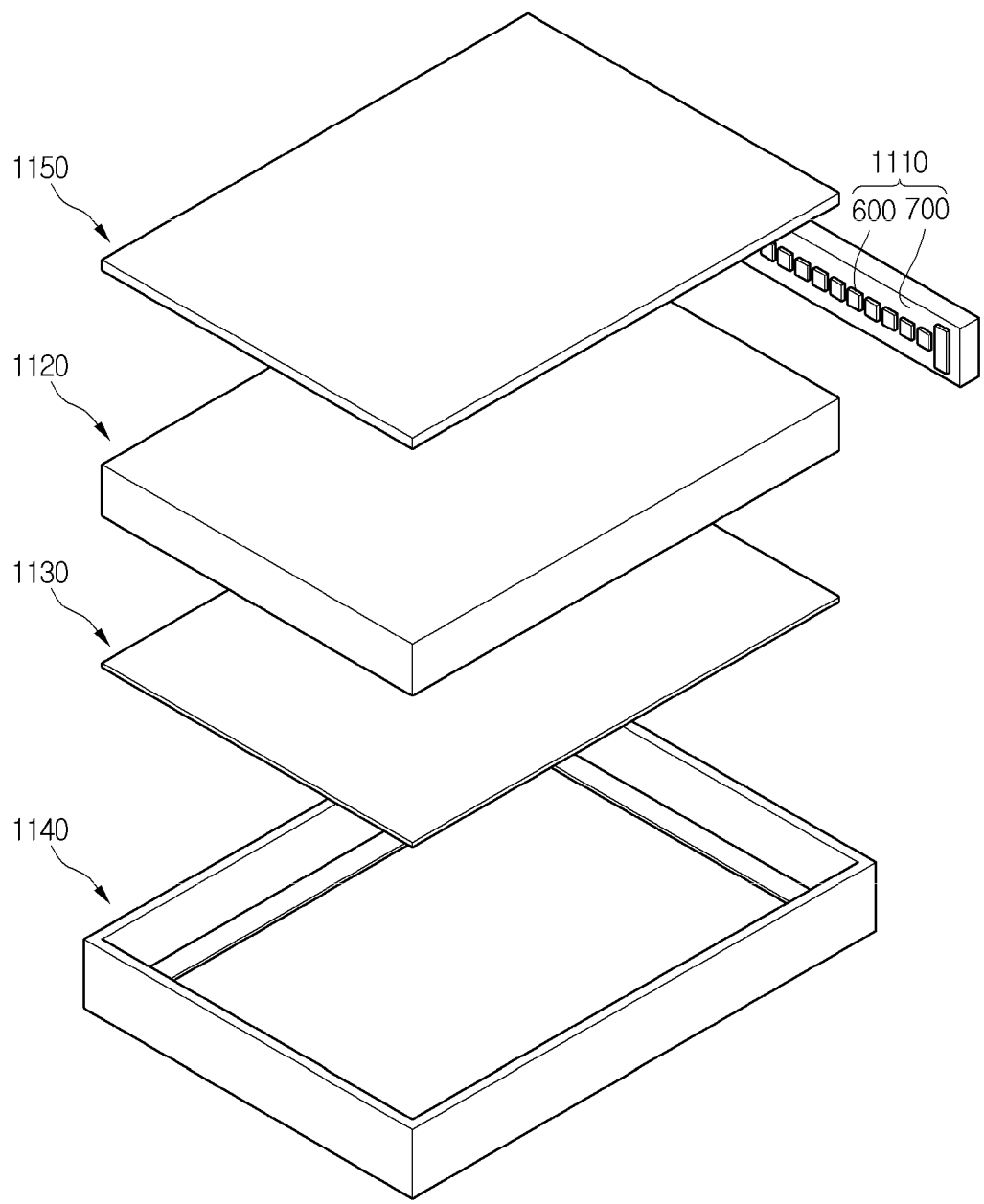
FIG. 17 is a view showing a backlight unit including a light emitting device package according to the exemplary embodiments.

FIG. 17 is a view showing a backlight unit 1100 including the light emitting device or the light emitting device package according to an exemplary embodiment. The backlight unit 1100 shown in FIG. 17 is an example of a lighting system and the embodiment is not limited thereto.

Referring to FIG. 17, the backlight unit 1100 may include a bottom frame 1140, a light guide member 1120 provided in the bottom frame 1140, and a light emitting module 1110 installed at one side or on the bottom surface of the light guide member 1120. In addition, a reflective sheet 1130 may be disposed under the light guide member 1120.

The bottom frame 1140 may have a box shape having an open top surface to receive the light guide member 1120, the light emitting module 1110 and the reflective sheet 1130 therein. In addition, the bottom frame 1140 may include metallic material or resin material, but the embodiment is not limited thereto.

The light emitting module 1110 may include a substrate 700 and a plurality of light emitting device packages 600 mounted on the substrate 700. The light emitting device packages 600 can supply light to the light guide member 1120.

Although the light emitting module 1110 may include the light emitting device package 600 mounted on the substrate 700 according to the embodiment, the light emitting device 100 may be directly installed in the light emitting module 1110 according to another embodiment.

As shown in FIG. 17, the light emitting module 1110 may be installed over at least one inner side of the bottom frame 1140 to provide the light to at least one side of the light guide member 1120.

In addition, the light emitting module 1110 can be provided under the bottom frame 1140 to provide the light toward the bottom surface of the light guide member 1120. Such an arrangement can be variously changed according to the design of the backlight unit 1100.

The light guide member 1120 may be installed in the bottom frame 1140. The light guide member 1120 may convert the light emitted from the light emitting module 1110 into the surface light to guide the surface light toward a display panel (not shown).

The light guide member 1120 may include a light guide plate. For instance, the light guide plate can be manufactured by using acryl-based resin, such as PMMA (polymethyl methacrylate), PET (polyethylene terephthalate), COC, PC (polycarbonate) or PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 may have a stack structure of the diffusion sheet, the light collection sheet, the brightness enhancement sheet, and the fluorescent sheet. In this case, the diffusion sheet 1150 uniformly diffuses the light emitted from the light emitting module 1110 such that the diffused light can be concentrated onto the display panel (not shown) by the light collection sheet. The light output from the light collection sheet may be randomly polarized and the brightness enhancement sheet may increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmissive plate or a transmissive film including luminescence materials.

The reflective sheet 1130 can be disposed under the light guide member 1120. The reflective sheet 1130 may reflect the light, which is emitted through the bottom surface of the light guide member 1120, toward the light exit surface of the light guide member 1120.

The reflective sheet 1130 may include resin material having a high reflectance, such as PET, PC or PVC resin, but the embodiment is not limited thereto.

Figure 18:
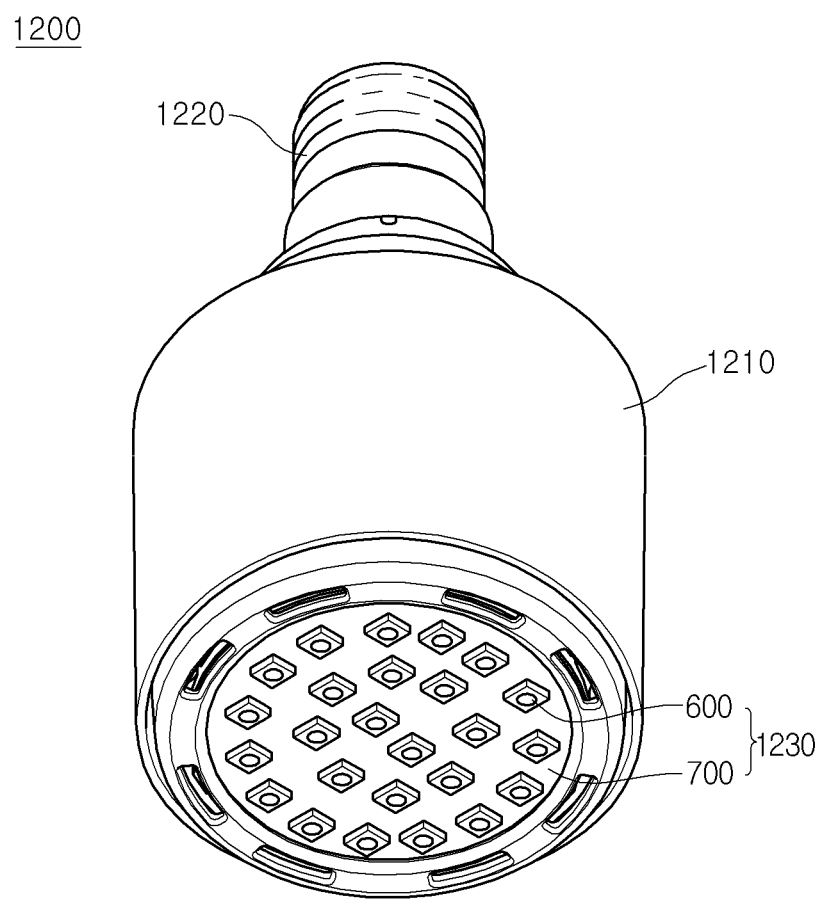
FIG. 18 is a view showing a lighting unit including a light emitting device package according to the exemplary embodiments.

FIG. 18 is a view showing a lighting unit 1200 including a light emitting device or a light emitting device package according to an exemplary embodiment. The lighting system 1200 shown in FIG. 18 is only one example and the embodiment is not limited thereto.

Referring to FIG. 18, the lighting system 1200 may include a case body 1210, a light emitting module 1230 installed in the case body 1210, and a connection terminal 1220 installed in the case body 1210 to receive power from an external power source.

Preferably, the case body 1210 may include material having superior heat dissipation property. For instance, the case body 1210 may include metallic material or resin material.

The light emitting module 1230 may include the substrate 700 and at least one light emitting device package 600 installed over the substrate 700. Although the light emitting module 1110 may include the light emitting device package 600 mounted on the substrate 700 according to the embodiment, the light emitting device 100 may be directly installed in the light emitting module 1110 according to another embodiment.

The substrate 700 may include an insulating member printed with a circuit pattern. For instance, the substrate 700 may include a PCB (printed circuit board), an MC (metal core) PCB, a flexible PCB, or a ceramic PCB.

In addition, the substrate 700 may include material that effectively reflects the light. The surface of the substrate 700 can be coated with a color, such as a white color or a silver color, to effectively reflect the light.

At least one light emitting device package 600 can be installed over the substrate 700. Each light emitting device package 600 may include at least one LED (light emitting diode). The LED may include a colored LED that emits the light having the color of red, green, blue or white and a UV (ultraviolet) LED that emits UV light.

The light emitting module 1230 can be variously arranged to provide various colors and brightness. For instance, a white LED, a red LED, and a green LED can be combined to achieve a high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow luminescence material. In this case, the light emitted from the light emitting module 1230 passes through the fluorescent sheet so that the light is viewed as white light.

The connection terminal 1220 may be electrically connected to the light emitting module 1230 to supply power to the light emitting module 1230. Referring to FIG. 18, the connection terminal 1220 may have a shape of a socket screw-coupled with the external power source, but the embodiment is not limited thereto. For instance, the connection terminal 1220 can be prepared in the form of a pin inserted into the external power source or connected to the external power source through a wire.

According to the lighting system as described above, at least one of the light guide member, the diffusion sheet, the light collection sheet, the brightness enhancement sheet and the fluorescent sheet may be provided in the path of the light emitted from the light emitting module, so that the desired optical effect can be achieved.

As described above, the lighting system may include a small-size light emitting device package, so that a small-size lighting system can be manufactured.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a light emitting structure layer including a first conductive semiconductor layer, an active layer formed under part of the first conductive semiconductor layer, and a second conductive semiconductor layer under the active layer;

an insulating layer disposed on a lateral surface of the active layer and the second conductive semiconductor layer and partially disposed under the second conductive semiconductor layer;

an electrode disposed under the first conductive semiconductor layer and electrically insulated from the active layer and the second conductive semiconductor layer by the insulating layer; and a metallic support layer disposed under the second conductive semiconductor layer, the insulating layer, and the electrode, wherein the metallic support layer includes a first conductive part electrically connected to the electrode, a second conductive part electrically connected to the second conductive semiconductor layer, and an insulating part disposed between the first and the second conductive parts and electrically insulating the first conductive part from the second conductive part, wherein the insulating part surrounds a lateral surface of the first and the second conductive parts and the insulating part is contacted with the first and the second conductive parts, wherein the first conductive part and the second conductive part have a width gradually increasing from a first surface to a second surface facing the insulating layer and the electrode, and wherein the insulating part has a width gradually decreasing from the first surface to the second surface facing the insulating layer and the electrode.

2. The light emitting device package of claim 1, further comprising an ohmic contact layer interposed between the second conductive semiconductor layer and the metallic support layer.

3. The light emitting device package of claim 1, wherein the first and the second conductive parts include a metallic layer and the insulating part includes an oxide metallic layer.

4. The light emitting device package of claim 3, wherein the metallic layer includes aluminum and the oxide metallic layer includes aluminum oxide.

5. The light emitting device package of claim 1, wherein the first and the second conductive parts have a same thickness, and are formed on a same horizontal plane.

6. The light emitting device package of claim 1, wherein the metallic support layer includes plural pairs of first and second metallic layers.

7. The light emitting device package of claim 1, further comprising a growth substrate on the first conductive semiconductor layer.

8. The light emitting device package of claim 7, further comprising an undoped nitride layer interposed between the first conductive semiconductor layer and the growth substrate.

9. The light emitting device package of claim 7, further comprising a luminescence layer on the growth substrate.

10. The light emitting device package of claim 7, further comprising a lens having a dome shape on the growth substrate.

11. A lighting system employing a light emitting device package as a light source, the lighting system comprising:

a light emitting module including a substrate and at least one light emitting device package mounted on the substrate, wherein the light emitting device package comprises:

a light emitting structure layer including a first conductive semiconductor layer, an active layer formed under part of the first conductive semiconductor layer, and a second conductive semiconductor layer under the active layer;

an insulating layer disposed on a lateral surface of the active layer and the second conductive semiconductor layer and partially disposed under the second conductive semiconductor layer;

an electrode disposed under the first conductive semiconductor layer and electrically insulated from the active layer and the second conductive semiconductor layer by the insulating layer; and a metallic support layer disposed under the second conductive semiconductor layer, the insulating layer, and the electrode, wherein the metallic support layer includes a first conductive part electrically connected to the electrode, a second conductive part electrically connected to the second conductive semiconductor layer, and an insulating part disposed between the first and the second conductive parts and electrically insulating the first conductive part from the second conductive part, wherein the insulating part surrounds a lateral side of the first and the second conductive parts and the insulating part is contacted with the first and the second conductive parts, wherein the first conductive part and the second conductive part have a width gradually increasing from a first surface to a second surface facing the insulating layer and the electrode, and wherein the insulating part has a width gradually decreasing from the first surface to the second surface facing the insulating layer and the electrode.

12. The lighting system of claim 11, further comprising an ohmic contact layer interposed between the second conductive semiconductor layer and the metallic support layer.

13. The lighting system of claim 11, wherein the first and the second conductive parts include a metallic layer, and the insulating part includes an oxide metallic layer.

14. The lighting system of claim 13, wherein the metallic layer includes aluminum and the oxide metallic layer includes aluminum oxide.

15. The lighting system of claim 11, wherein the first and the second conductive parts have a same thickness, and are formed on a same horizontal plane.

16. The lighting system of claim 11, wherein the metallic support layer includes plural pairs of first and second metallic layers.

17. The light emitting device package of claim 1, wherein the second conductive part is overlapped with the first conductive semiconductor layer, the second conductive semiconductor layer, and the active layer in a vertical direction.

18. The lighting system of claim 11, wherein the second conductive part is overlapped with the first conductive semiconductor layer, the second conductive semiconductor layer, and the active layer in a vertical direction.

* * * * *